(12) United States Patent
Kurahashi et al.

(10) Patent No.: US 11,309,718 B2
(45) Date of Patent: Apr. 19, 2022

(54) BATTERY MONITORING SYSTEM AND BATTERY MONITORING APPARATUS

(71) Applicant: Envision AESC Japan Ltd., Zama (JP)

(72) Inventors: Naoya Kurahashi, Kobe (JP); Kazuomi Hayashi, Zama (JP)

(73) Assignees: DENSO TEN Limited, Kobe (JP); AUTOMOTIVE ENERGY SUPPLY CORPORATION, Zama (JP)

( * ) Notice: Subject to any disclaimer, the term of this patent is extended or adjusted under 35 U.S.C. 154(b) by 329 days.

(21) Appl. No.: 15/914,442

(22) Filed: Mar. 7, 2018

(65) Prior Publication Data

US 2018/0278066 A1   Sep. 27, 2018

(30) Foreign Application Priority Data

Mar. 27, 2017  (JP) .............................. JP2017-061530

(51) Int. Cl.
*H02J 7/00* (2006.01)
*H01M 2/10* (2006.01)
*H01M 10/48* (2006.01)
*B60L 58/12* (2019.01)
(Continued)

(52) U.S. Cl.
CPC .......... *H02J 7/0021* (2013.01); *B60L 3/0046* (2013.01); *B60L 3/04* (2013.01); *B60L 50/60* (2019.02);
(Continued)

(58) Field of Classification Search
CPC .......... H02J 7/0021; H02J 7/0077; H02J 7/00; H01M 2/1083; H01M 1/10; H01M 10/482;
(Continued)

(56) References Cited

U.S. PATENT DOCUMENTS

2010/0244847 A1*  9/2010  Kudo .................... B60L 3/0084
                                                        324/433
2011/0054708 A1*  3/2011  Sato ........................ G04R 20/04
                                                        700/286

(Continued)

FOREIGN PATENT DOCUMENTS

JP          2003-209907 A       7/2003
JP          2005-151697 A       6/2005

*Primary Examiner* — Richard Isla
*Assistant Examiner* — Dung V Bui
(74) *Attorney, Agent, or Firm* — Oliff PLC

(57) ABSTRACT

A battery monitoring system according to an embodiment includes a plurality of battery monitoring apparatuses provided in accordance with battery packs. Each of the battery monitoring apparatuses includes a setting unit and a communication unit. The setting unit sets a communication system to at least one of a first communication system and a second communication system having a shorter communication period than that of the first communication system, sets the communication system to the second communication system during a failure diagnosis to be performed in a start-up of the corresponding battery monitoring apparatus, and sets the communication system to the first communication system after the failure diagnosis. The communication unit communicates with another battery monitoring apparatus of the plurality of battery monitoring apparatuses by using the communication system set by the setting unit.

4 Claims, 9 Drawing Sheets

(51) Int. Cl.
*B60L 58/21* (2019.01)
*B60L 3/04* (2006.01)
*G01R 31/327* (2006.01)
*G01R 31/396* (2019.01)
*B60L 3/00* (2019.01)
*G01R 31/392* (2019.01)
*B60L 50/60* (2019.01)
*H01M 50/20* (2021.01)

(52) U.S. Cl.
CPC .............. *B60L 58/12* (2019.02); *B60L 58/21* (2019.02); *G01R 31/3278* (2013.01); *G01R 31/392* (2019.01); *G01R 31/396* (2019.01); *H01M 10/482* (2013.01); *H01M 50/20* (2021.01); *H02J 7/0077* (2013.01); *B60L 2260/44* (2013.01)

(58) Field of Classification Search
CPC .......................... G01R 31/392; G01R 31/396; G01R 31/3278; B60L 58/12; B60L 58/21; B60L 3/0046; B60L 2260/44; B60L 11/18
USPC ........................................................ 320/134
See application file for complete search history.

(56) References Cited

U.S. PATENT DOCUMENTS

| | | | |
|---|---|---|---|
| 2011/0298276 A1* | 12/2011 | Takahashi | F02N 11/10 307/10.6 |
| 2013/0049973 A1* | 2/2013 | Matsumoto | B60L 15/20 340/636.12 |
| 2014/0354054 A1* | 12/2014 | Katou | B60L 58/18 307/43 |
| 2015/0084598 A1* | 3/2015 | Song | H02J 7/0047 320/128 |
| 2016/0054393 A1* | 2/2016 | Hase | H04L 61/2038 324/434 |
| 2016/0163127 A1* | 6/2016 | Kim | H02H 3/14 701/36 |
| 2016/0233560 A1* | 8/2016 | Kanoh | H01M 10/4207 |

* cited by examiner

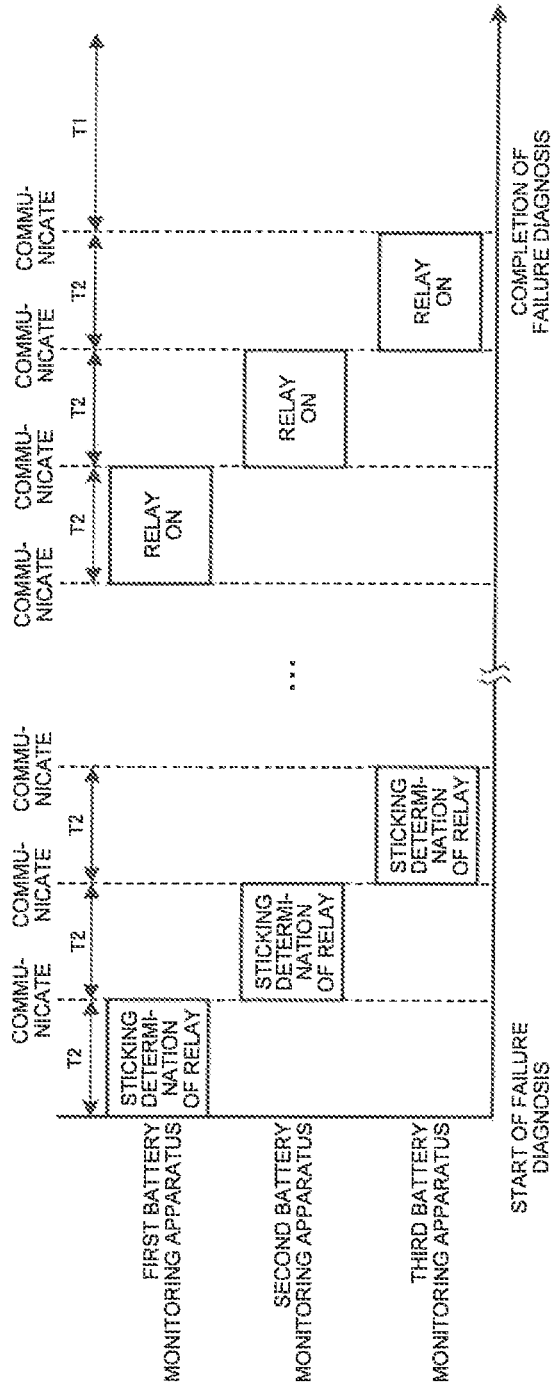

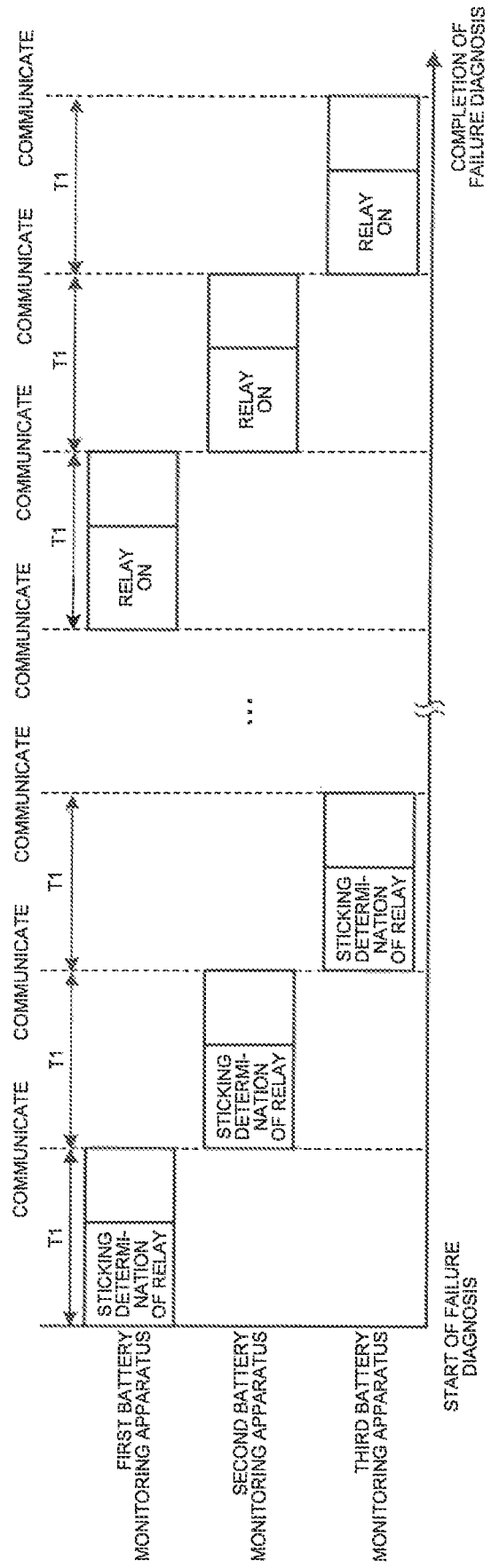

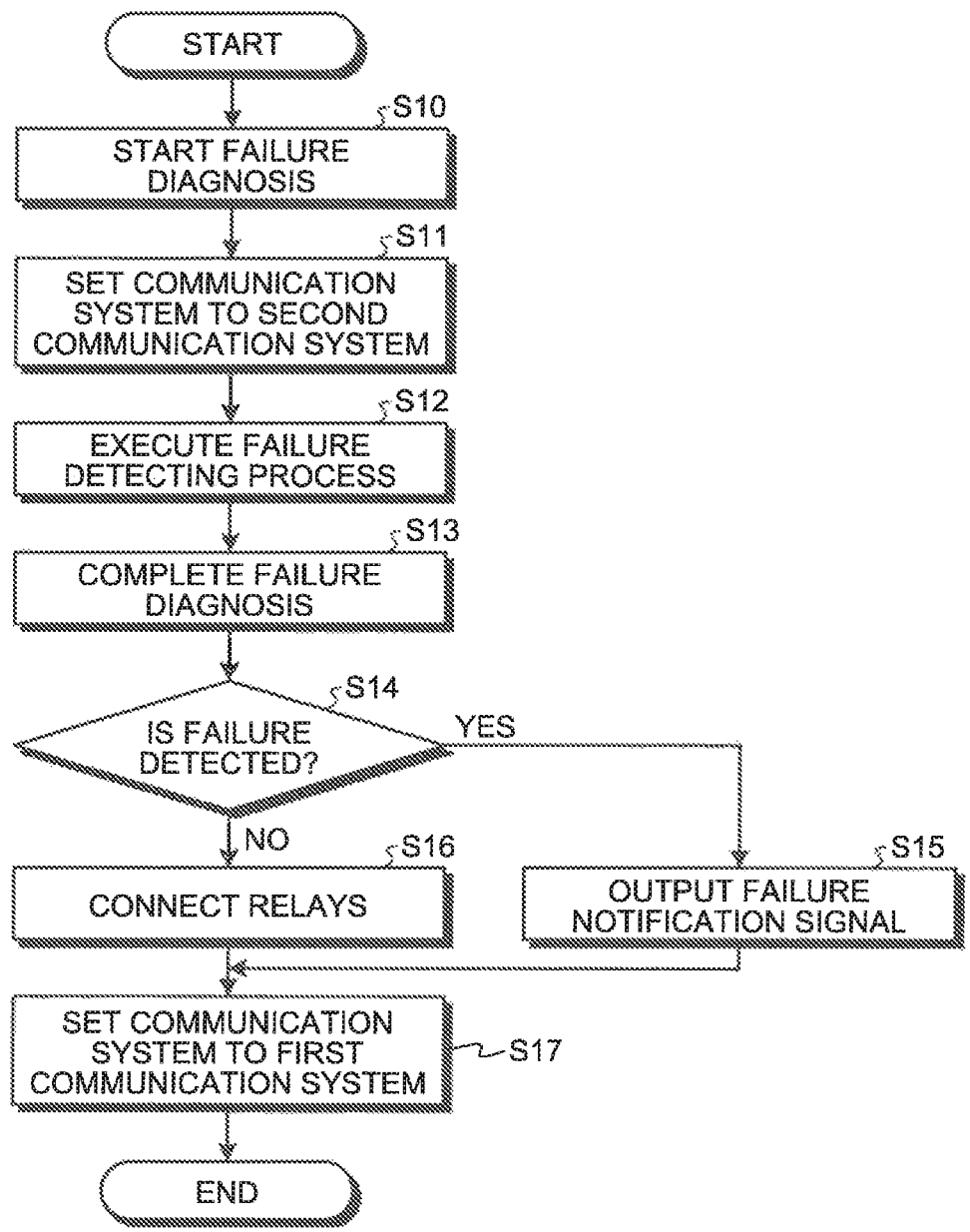

BATTERY MONITORING SYSTEM AND BATTERY MONITORING APPARATUS

CROSS-REFERENCE TO RELATED APPLICATION

This application is based upon and claims the benefit of priority of the prior Japanese Patent Application No. 2017-061530, filed on Mar. 27, 2017 the entire contents of which are incorporated herein by reference.

FIELD

The embodiment discussed herein is directed to a battery monitoring system and a battery monitoring apparatus.

BACKGROUND

Conventionally, there is known a battery monitoring system that detects a failure in a battery pack, such as sticking of a relay, and causes battery monitoring apparatuses to communicate the failure diagnosis result therebetween (see Japanese Laid-open Patent Publication No. 2003-209907, for example).

However, in the above battery monitoring system, because a communication system to be used in the communication between the monitoring apparatuses is not considered, when a failure diagnosis is performed at a start-up of the system, a time interval needed for the failure diagnosis becomes long, and thus there exists a fear that the battery monitoring system is not able to be started up immediately. Thus, in the above battery monitoring system, there exists room for improvement in shortening the startup time interval.

SUMMARY

A battery monitoring system according to an embodiment includes a plurality of battery monitoring apparatuses provided in accordance with battery packs. Each of the battery monitoring apparatuses includes a setting unit and a communication unit. The setting unit sets a communication system to at least one of a first communication system and a second communication system having a shorter communication period than that of the first communication system, sets the communication system to the second communication system during a failure diagnosis to be performed in a start-up of the corresponding battery monitoring apparatus, and sets the communication system to the first communication system after the failure diagnosis. The communication unit communicates with another battery monitoring apparatus of the plurality of battery monitoring apparatuses by using the communication system set by the setting unit.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 6A is a diagram illustrating a communication state during a failure diagnosis according to the present embodiment;

FIG. 6B is a diagram illustrating a communication state during a failure diagnosis according to a comparative example, which is performed with a first communication period;

FIG. 7 is a flowchart illustrating a failure diagnosing process according to the present embodiment;

DESCRIPTION OF EMBODIMENT

Hereinafter, an embodiment of a battery monitoring system and a battery monitoring apparatus according to the present application will be described in detail with reference to the accompanying drawings. The present disclosure is not limited to the embodiment described in the following.

Outline of Present Embodiment

Figure 1:
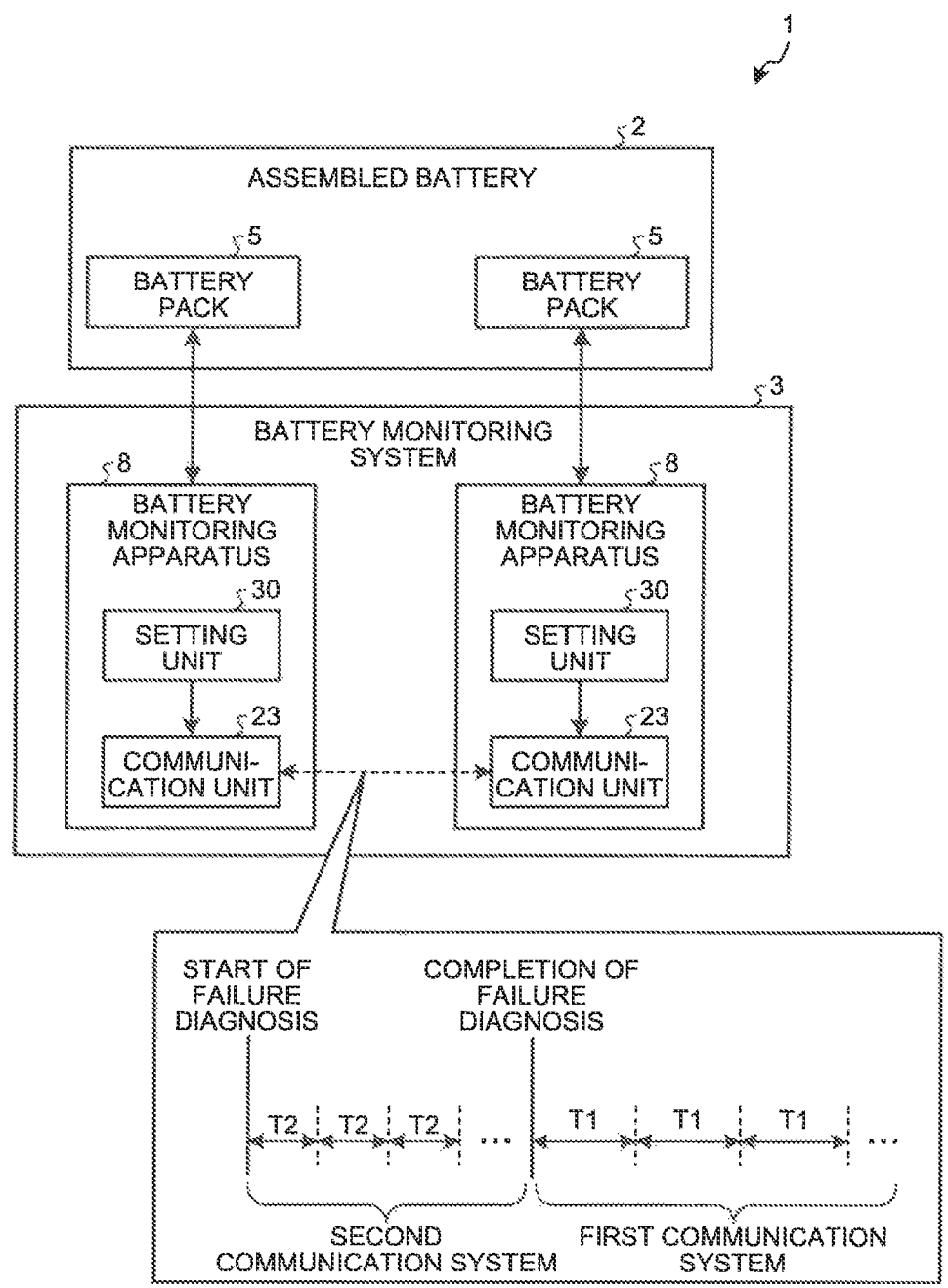
FIG. 1 is a diagram illustrating the outline of a battery monitoring system according to an embodiment.

First, the outline of a battery monitoring system 3 according to the present embodiment will be explained with reference to FIG. 1. FIG. 1 is a diagram illustrating the outline of the battery monitoring system 3 according to the present embodiment. The battery monitoring system 3 according to the present embodiment is employed for a power supplying system 1 that is for vehicle. The vehicle includes a Hybrid Electric Vehicle (HEV), an Electric Vehicle (EV), and a Fuel Cell Vehicle (FCV) among other things. A case will be exemplified in which the battery monitoring system 3 is employed for the power supplying system 1 for vehicle, however, this battery monitoring system 3 may be employed for a power supplying system for home use.

The battery monitoring system 3 includes a plurality of battery monitoring apparatuses 8 for monitoring operation states of respective battery packs 5 that constitute an assembled battery 2 to be monitored. In FIG. 1, the case will be explained as one example in which the battery monitoring system 3 includes the two battery monitoring apparatuses 8, not limited thereto.

When a start switch 11 (see FIG. 2) is turned ON to start up the power supplying system 1 (the battery monitoring system 3), the battery monitoring apparatuses 8 first performs failure diagnoses on the battery packs 5 at a start-up of the battery monitoring apparatuses 8. Each of the battery monitoring apparatuses 8 diagnoses, as the failure diagnosis, sticking (ON sticking and OFF sticking) of a relay 7A or 7B (see FIG. 2) and a failure in battery cells 6 (see FIG. 2) among other things. When detecting no failure, the corresponding battery monitoring apparatus 8 turns ON the relays 7A and 7B to complete the failure diagnosis. Thus, the battery packs 5 (assembled battery 2) start to supply electric power to an outside load (not illustrated) such as a motor. Similarly thereto, when the start switch is turned ON so as to start to charge the battery packs 5, the battery monitoring apparatuses 8 perform failure diagnoses on the battery packs 5.

Among the battery monitoring apparatuses 8, the one battery monitoring apparatus 8 is set to a master battery monitoring apparatus and the other battery monitoring apparatuses 8 are set to slave battery monitoring apparatuses, and communication of an instruction signal, a failure diagnosis result, etc. is performed between the battery monitoring apparatuses 8 by using communication units 23.

The battery monitoring apparatus 8 changes a communication system between during a failure diagnosis and after the failure diagnosis by using a setting unit 30 so as to perform the communication. The setting unit 30 sets a communication method to a first communication system after a failure diagnosis, and sets the communication method to a second communication system having a communication period shorter than that of the first communication system during the failure diagnosis.

The first communication system is a communication system by which the communication units 23 communicate therebetween with a first communication period T1. The first communication period T1 is a predetermined period. When the communication system is set to the first communication system, the battery monitoring apparatuses 8 collectively communicate therebetween an instruction signal and a result of an event such as voltage detection of the battery cells 6 at a predetermined timing.

The second communication system is a communication system by which the communication units 23 communicate therebetween with a second communication period T2. The second communication period T2 is a period of termination of an event, such as a sticking determination of the relay 7A or 7B, in the battery monitoring apparatus 8. The second communication period T2 is set for each event. When the communication system is set to the second communication system, the battery monitoring apparatuses 8 communicates therebetween for each time when an event is terminated.

In this manner, the communication is performed at each time when an event is terminated during a failure diagnosis, so that it is possible to immediately complete the failure diagnosis and further to cause the battery packs 5 to rapidly supply electric power to the outside load.

In the following, the power supplying system 1, for which the battery monitoring system 3 according to the present embodiment is employed, will be explained more specifically.

Outline of Power Supplying System

Figure 2:
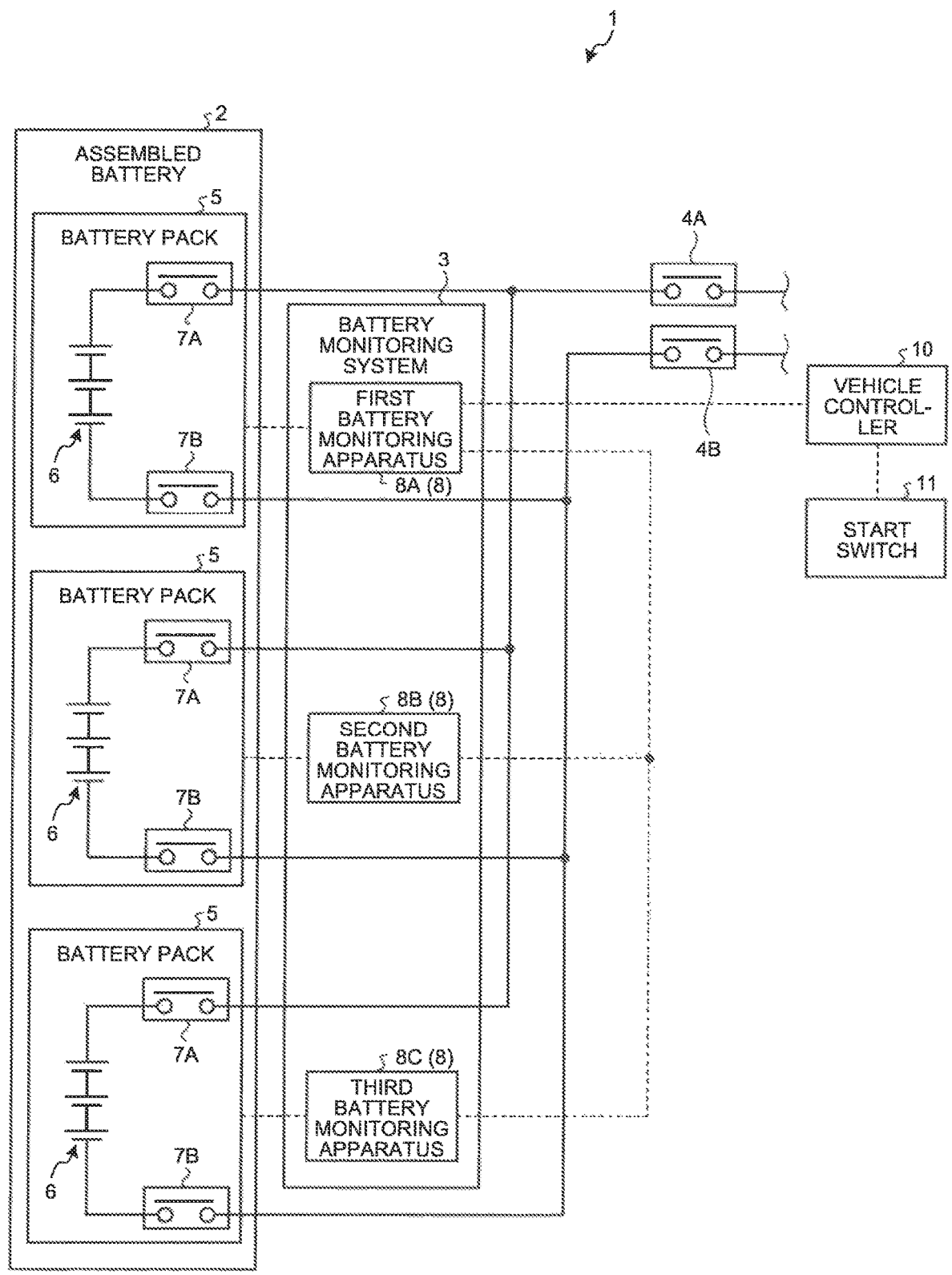
FIG. 2 is a diagram illustrating a schematic configuration of a power supplying system.

The power supplying system 1 will be explained with reference to FIG. 2. FIG. 2 is a diagram illustrating a schematic configuration of the power supplying system 1 according to the present embodiment.

The power supplying system 1 includes the assembled battery 2 and the battery monitoring system 3. In the power supplying system 1, when main relays 4A and 4B are turned ON and OFF, the assembled battery 2 is connected with and shut from the outside load.

The assembled battery 2 is, for example, a lithium-ion secondary battery and a nickel-hydrogen secondary battery among other things. The assembled battery 2 is constituted of the plurality of battery packs 5 that are connected in parallel. Each of the battery packs 5 includes the plurality of battery cells 6 connected in serial and the relays 7A and 7B. When the relays 7A and 7B are turned ON and OFF, the battery pack 5 is connected with and shut from the outside load. The case is exemplified in which the number of the battery packs 5 is three and that of the battery cells 6 is three, not limited thereto.

The battery monitoring system 3 includes the plurality of battery monitoring apparatuses 8. Each of the battery monitoring apparatuses 8 includes an Electronic Control Unit (ECU). The battery monitoring apparatuses 8 are provided for the respective battery packs 5. In other words, the three battery monitoring apparatuses 8 are here provided whose number is according to that of the battery packs 5. Among the plurality of battery monitoring apparatuses 8, the one battery monitoring apparatus 8 is a master battery monitoring apparatus (hereinafter, may be referred to as "first battery monitoring apparatus 8A"), the other battery monitoring apparatuses 8 are slave battery monitoring apparatuses (hereinafter, may be referred to as "second battery monitoring apparatus 8B" and "third battery monitoring apparatus 8C").

Among the plurality of battery monitoring apparatuses 8, the two battery monitoring apparatuses 8 communicate therebetween, the one battery monitoring apparatus 8 is set to a master battery monitoring apparatus (first battery monitoring apparatus 8A), and the other battery monitoring apparatus 8 is set to a slave battery monitoring apparatus (second battery monitoring apparatus 8B or third battery monitoring apparatus 8C). In other words, the master battery monitoring apparatus and the slave battery monitoring apparatus communicate only therebetween, and the slave battery monitoring apparatuses do not communicate therebetween.

In the battery monitoring system 3, communication with a vehicle controller 10 is performed by the first battery monitoring apparatus 8A. The vehicle controller 10 inputs, to the first battery monitoring apparatus 8A, a signal associated with ON and OFF of the start switch 11. The first battery monitoring apparatus 8A outputs, to the vehicle controller 10, a signal associated with states of the battery packs 5, voltages of the battery packs 5, and failures of the battery packs 5 among other things.

Figure 3:
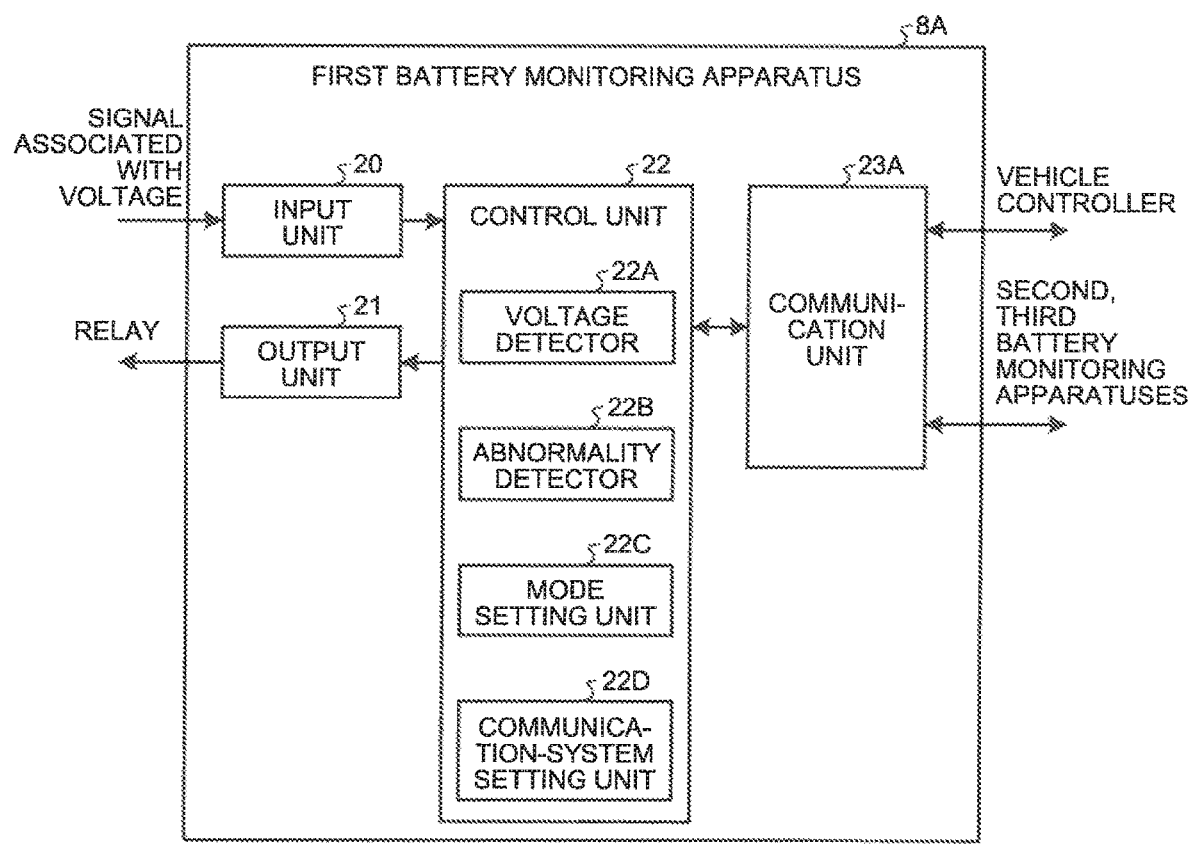
FIG. 3 is a diagram illustrating a schematic configuration of a first battery monitoring apparatus.

The first battery monitoring apparatus 8A will be explained with reference to FIG. 3. FIG. 3 is a diagram illustrating a schematic configuration of the first battery monitoring apparatus 8A. The first battery monitoring apparatus 8A communicates with the vehicle controller 10, the second battery monitoring apparatus 8B, and the third battery monitoring apparatus 8C.

The first battery monitoring apparatus 8A includes an input unit 20, an output unit 21, a control unit 22, and a communication unit 23A.

A signal associated with voltages of the battery pack 5 and the battery cells 6 etc. is input to the input unit 20. The output unit 21 outputs a signal for switching between ON and OFF of the relays 7A and 7B.

The control unit 22 includes a voltage detector 22A, an abnormality detector 22B, a mode setting unit 22C, and a communication-system setting unit 22D. The control unit 22 is constituted of a Central Processing Unit (CPU), a Read Only Memory (ROM), and Random Access Memory (RAM) among other things, and the CPU reads a stored computer program to exert functions of the control unit 22. The control unit 22 may be constituted of a plurality of control units.

The voltage detector 22A detects the voltages on the basis of the signal input to the input unit 20. The abnormality detector 22B compares the detected voltages with predetermined voltages, and determines whether each of the voltages is normal or abnormal, so as to detect a voltage abnormality.

The abnormality detector 22B performs a failure diagnosis on the battery pack 5 in a start-up of the first battery monitoring apparatus 8A, in addition to the detection of a voltage abnormality in the battery pack 5 and the battery cells 6. In a case where an instruction for turning OFF the relay 7A is output and the voltage to be zero in the normal condition is larger than zero, for example, the abnormality detector 22B determines that ON sticking occurred in the relay 7A so as to detect the ON sticking of the relay 7A.

The mode setting unit 22C sets a voltage detecting mode performed by the first battery monitoring apparatus 8A to a failure diagnosing mode or a common mode. The failure diagnosing mode is a mode for performing a failure diagnosis on the battery packs 5 when the start switch 11 (see FIG. 2) is turned ON, the first battery monitoring apparatus 8A is started up and the battery packs 5 start to perform charge and discharge. The common mode is a mode for turning ON the main relays 4A and 4B to cause the battery packs 5 (assembled battery 2) to perform charge and discharge.

When the start switch 11 is turned ON, the mode setting unit 22C sets the voltage detecting mode to the failure diagnosing mode, when no failure in the battery pack 5 is detected in the failure diagnosing mode and the failure diagnosis is completed, the mode setting unit 22C sets the voltage detecting mode to the common mode.

The communication-system setting unit 22D sets a communication system to the first communication system or the second communication system in accordance with the voltage detecting mode. When the voltage detecting mode is set to the common mode, the communication-system setting unit 22D sets the communication system to the first communication system. In the first communication system, the first battery monitoring apparatus 8A communicates, with the first communication period T1, with the vehicle controller 10, the second battery monitoring apparatus 8B, and the third battery monitoring apparatus 8C.

When the voltage detecting mode is set to the failure diagnosing mode, the communication-system setting unit 22D sets the communication system to the second communication system. In the second communication system, the first battery monitoring apparatus 8A communicates, with the second communication period T2, with the vehicle controller 10, the second battery monitoring apparatus 8B, and the third battery monitoring apparatus 8C. The communication-system setting unit 22D corresponds to the "setting unit 30" illustrated in FIG. 1.

The communication unit 23A performs communication between (i) the first battery monitoring apparatus 8A and (ii) the vehicle controller 10, the second battery monitoring apparatus 8B, and the third battery monitoring apparatus 8C, on the basis of the communication system set by the communication-system setting unit 22D. Therefore, when the second communication system is set, in other words, when the voltage detecting mode is the failure diagnosing mode, the communication is performed with a communication period that is shorter than that when the first communication system is set, in other words, when the voltage detecting mode is the common mode.

When a failure is detected by the first battery monitoring apparatus 8A to the third battery monitoring apparatus 8C, the communication unit 23A outputs, to the vehicle controller 10, a failure notification signal associated with a failure content. The communication unit 23A corresponds to the "communication unit 23" illustrated in FIG. 1.

Figure 4:
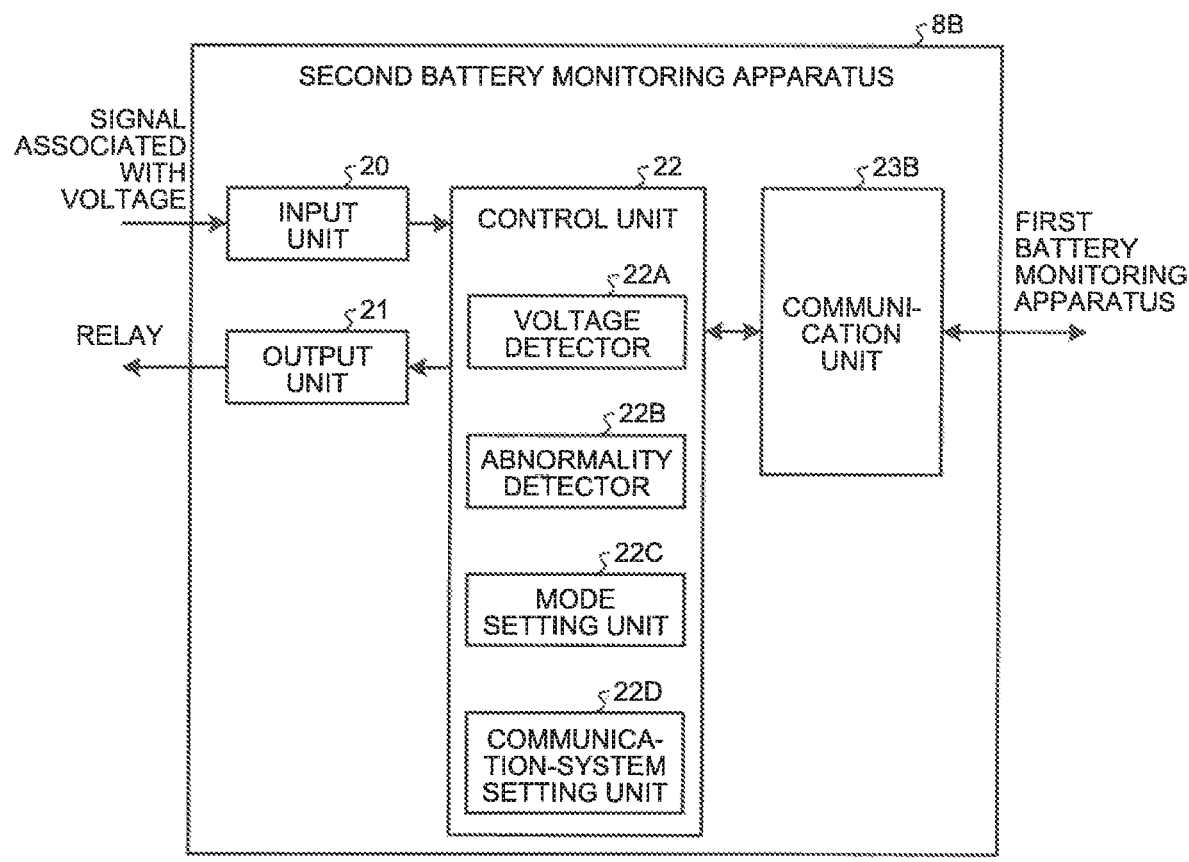
FIG. 4 is a diagram illustrating a schematic configuration of a second battery monitoring apparatus.
Figure 5:
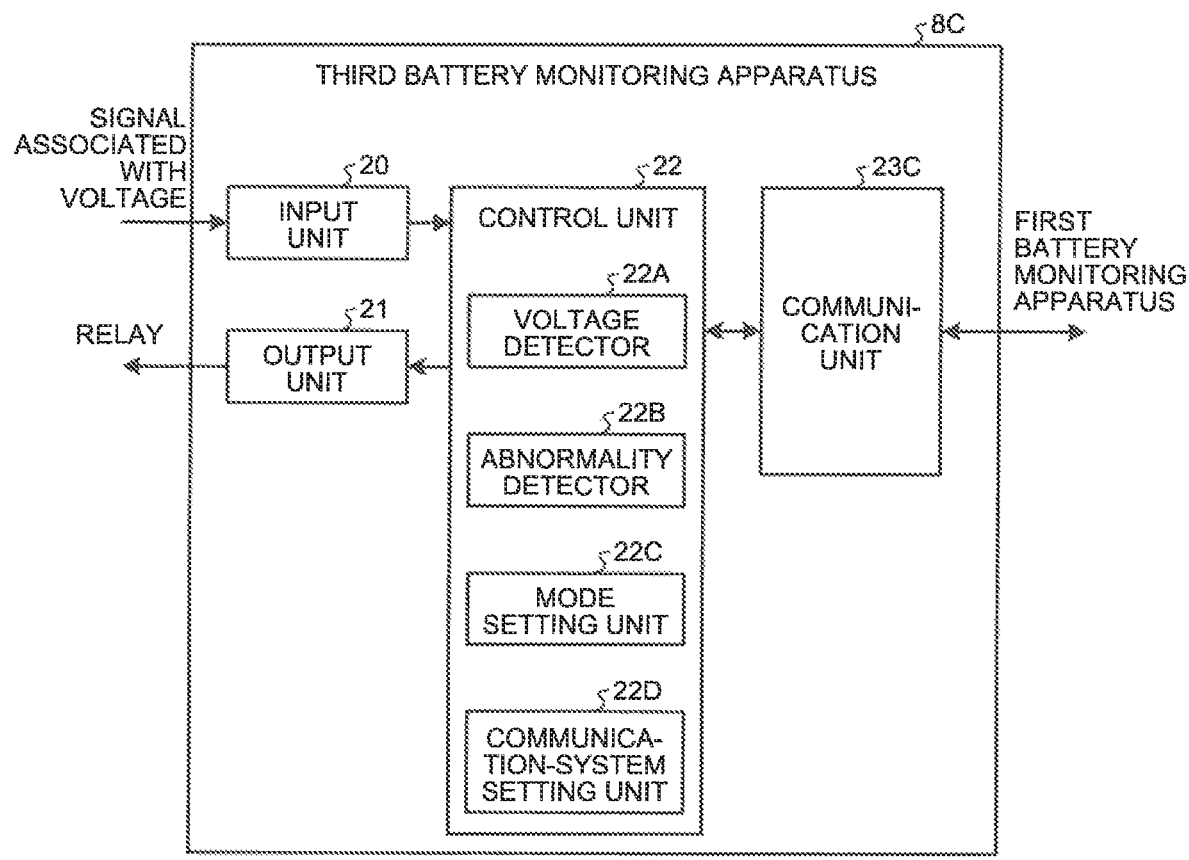
FIG. 5 is a diagram illustrating a schematic configuration of a third battery monitoring apparatus.

Next, the second battery monitoring apparatus 8B and the third battery monitoring apparatus 8C will be explained with reference to FIGS. 4 and 5. FIG. 4 is a diagram illustrating a schematic configuration of the second battery monitoring apparatus 8B. FIG. 5 is a diagram illustrating a schematic configuration of the third battery monitoring apparatus 8C. The configuration of the second battery monitoring apparatus 8B and that of the third battery monitoring apparatus 8C are basically similar to that of the first battery monitoring apparatus 8A, and the common parts of the configurations are represented with same symbols and the description is omitted appropriately.

A communication unit 23B of the second battery monitoring apparatus 8B and a communication unit 23C of the third battery monitoring apparatus 8C individually communicate with only the communication unit 23A of the first battery monitoring apparatus 8A.

Communication State in Failure Diagnosis

Next, communication during a failure diagnosis will be explained with reference to FIGS. 6A and 6B. FIG. 6A is a diagram illustrating a communication state during a failure diagnosis according to the present embodiment. FIG. 6B is a diagram illustrating a communication state during a failure diagnosis according to a comparative example, which is performed with the first communication period T1. No failure is here assumed to be detected, and each event is assumed to be performed with the constant second communication period T2.

When a start-up of the battery monitoring system 3 is started and further the failure diagnosis is started, an ON-sticking determination of the relay 7A is first performed, as an event, in the first battery monitoring apparatus 8A. There exist determinations of ON sticking and OFF sticking in the sticking determination of the relay and both determinations are performed, only the ON-sticking determination will be described in the following. When ON sticking of the relay 7A is not detected in the first battery monitoring apparatus 8A, communication between the first battery monitoring apparatus 8A and the second battery monitoring apparatus 8B is performed after the second communication period T2 elapsed at a termination of an event.

An ON-sticking determination of the relay 7A is performed, as an event, in the second battery monitoring apparatus 8B. When ON sticking of the relay 7A is not detected in the second battery monitoring apparatus 8B, communication is performed between the second battery monitoring apparatus 8B and the first battery monitoring apparatus 8A after the second communication period T2 elapsed, and communication is performed between the first battery monitoring apparatus 8A and the third battery monitoring apparatus 8C. In FIG. 6A, these communications are illustrated together. The same applies to drawings to be described later.

An ON-sticking determination of the relay 7A is performed, as an event, in the third battery monitoring apparatus 8C. When ON sticking of the relay 7A is not detected in the third battery monitoring apparatus 8C, communication is performed between the third battery monitoring apparatus 8C and the first battery monitoring apparatus 8A after the second communication period T2 elapsed. Thereafter, ON sticking of the relay 7B is similarly detected, for example.

In this manner, when the sticking determinations of the relays 7A and 7B are completed, an instruction for causing the relays 7A and 7B to turn ON is output from the first battery monitoring apparatus 8A, next, an instruction for causing the relays 7A and 7B to turn ON is output by the second battery monitoring apparatus 8B and then that is output by the third battery monitoring apparatus 8C, and the failure diagnosis is completed.

On the contrary, in a comparative example, for example, an ON-sticking determination of the relay 7A is performed by the first battery monitoring apparatus 8A and even when the event is terminated, the communication is not performed until the first communication period T1 elapsed. Thus, a time interval until the completion of the failure diagnosis, in other words, a startup time interval of the battery monitoring system 3 becomes long.

In a case where charge or discharge is performed on the battery packs 5, when electric power is supplied to the outside load by using the battery pack 5 monitored by the first battery monitoring apparatus 8A without turning ON all of the relays 7A and 7B, for example, only the relays 7A and 7B of the battery pack 5 monitored by the first battery monitoring apparatus 8A may be turned ON.

Failure Diagnosing Process

Next, a failure diagnosing process according to the present embodiment will be explained with reference to FIG. 7. FIG. 7 is a flowchart illustrating the failure diagnosing process according to the present embodiment.

When the start switch 11 is turned ON and a failure diagnosis is started (Step S10: Yes), each of the battery monitoring apparatuses 8 sets a communication system to the second communication system (Step S11).

Each of the battery monitoring apparatuses 8 executes the failure detecting process (Step S12). In the failure detecting process, as described above, the first battery monitoring apparatus 8A and the second battery monitoring apparatus 8B, and the first battery monitoring apparatus 8A and the third battery monitoring apparatus 8C communicate therebetween with the second communication period T2, failure detections (sticking detection of relays 7A and 7B) are performed on the battery packs 5, and the failure diagnosis is completed (Step S13).

When a failure is detected in the failure detecting process (Step S14: Yes), the communication unit 23A of the first battery monitoring apparatus 8A outputs, to the vehicle controller 10, a failure notification signal associated with failure contents of the one or more battery packs 5 (Step S15). Next, each of the battery monitoring apparatuses 8 sets the communication system to the first communication system (Step S17).

When no failure is detected in the failure detecting process (Step S14: No), each of the battery monitoring apparatuses 8 individually connects the corresponding relays 7A and 7B (Step S16), and then the corresponding battery monitoring apparatus 8 sets the communication system to the first communication system (Step S17).

Effects of Present Embodiment

Next, effects of the present embodiment will be described.

The battery monitoring system 3 includes the plurality of battery monitoring apparatuses 8. Each of the battery monitoring apparatuses 8 sets the communication system to the second communication system having the shorter communication period than that of the first communication system during the failure diagnosis to be performed in the start-up of the corresponding battery monitoring apparatus 8, and sets the communication system to the first communication system after the failure diagnosis. Thus, the failure diagnosis is able to be completed in a short time interval, so that it is possible to shorten a startup time interval of the battery monitoring system 3. It is accordingly possible to shorten a startup time interval of the power supplying system 1 and the vehicle. The communication system is set to the first communication system after the failure diagnosis to be able to reduce communication load.

The battery monitoring system 3 individually performs communication only between the first battery monitoring apparatus 8A that is a master battery monitoring apparatus and the second battery monitoring apparatus 8B that is a slave battery monitoring apparatus, and between the first battery monitoring apparatus 8A and the third battery monitoring apparatus 8C that is the slave battery monitoring apparatus.

Such a system may be considered that performs, during a failure diagnosis, communication between the second battery monitoring apparatus 8B and the third battery monitoring apparatus 8C (slave battery monitoring apparatuses), sends a failure diagnosis result diagnosed by the second battery monitoring apparatus 8B to the third battery monitoring apparatus 8C, and sends a failure diagnosis result diagnosed by the third battery monitoring apparatus 8C to the first battery monitoring apparatus 8A, for example.

However in this case, an identifier (ID) for recognizing the failure diagnosis result of the second battery monitoring apparatus 8B is to be set for the third battery monitoring apparatus 8C, and thus the third battery monitoring apparatus 8C becomes complicated. When the number of slave battery monitoring apparatuses is large, a larger number of IDs are to be set for a plurality of slave battery monitoring apparatuses as the order of the slave battery monitoring apparatus is lower, and the slave battery monitoring apparatuses accordingly becomes complicated.

On the contrary, in the present embodiment, communication is not performed between the second battery monitoring apparatus 8B and the third battery monitoring apparatus 8C (slave battery monitoring apparatuses), and thus an ID for identifying a failure diagnosis result of the second battery monitoring apparatus 8B is not to be set for the third battery monitoring apparatus 8C, it is accordingly possible to simplify the third battery monitoring apparatus 8C.

Other Configuration Example

Figure 8:
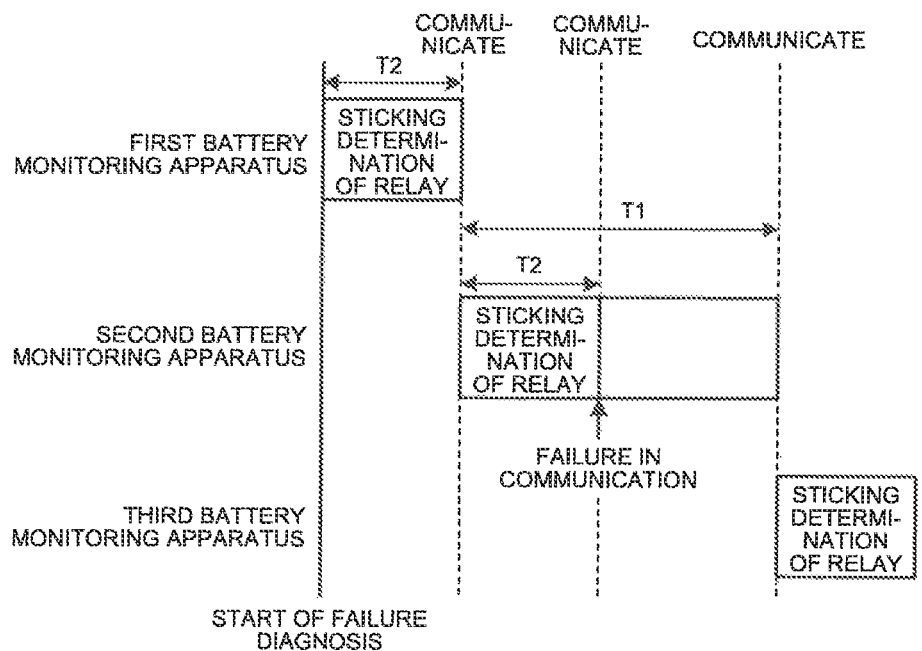
FIG. 8 is a diagram illustrating a communication example to be performed by another configuration example when communication using a second communication system failed.

In the above embodiment, each of the battery monitoring apparatus 8 is configured to set a communication system to the second communication system during the failure diagnosis, however, the corresponding battery monitoring apparatus 8 may be configured to perform communication by using the first communication system in addition to the second communication system. Thus, as illustrated in FIG. 8, for example, even when sticking (ON sticking or OFF sticking) of the relay 7A is determined in the second battery monitoring apparatus 8B and communication using the second communication system fails, the communication is able to be performed by using the first communication system. FIG. 8 is a diagram illustrating a communication example to be performed by another configuration example when communication using the second communication system failed.

Thus, sticking of the relay 7A is able to be determined by the third battery monitoring apparatus 8C after the first communication period T1 elapsed.

In this manner, the battery monitoring apparatus 8 performs communication by using the first communication system in addition to the second communication system during the failure diagnosis, so that it is possible to reliably perform the failure diagnosis.

Figure 9:
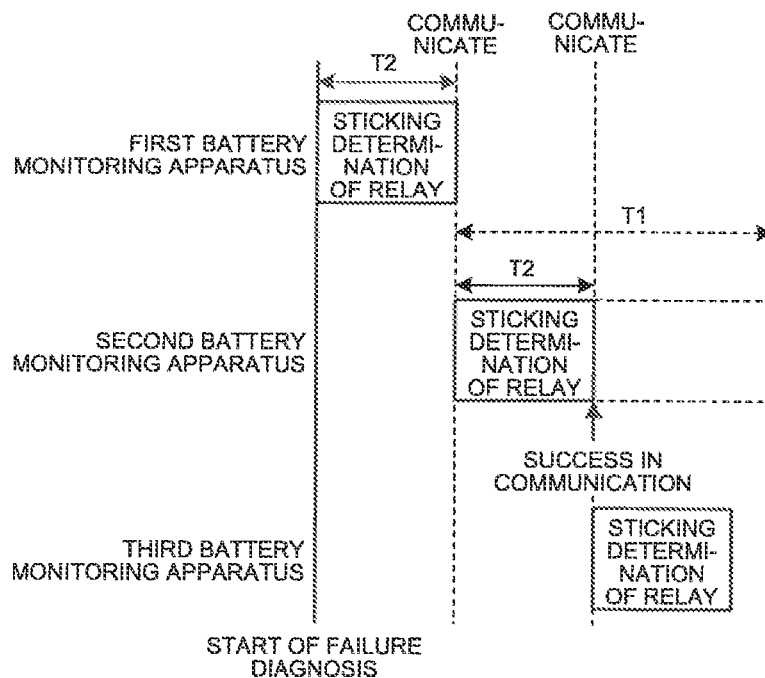
FIG. 9 is a diagram illustrating a communication example to be performed by the other configuration example when the communication using the second communication system succeeded.

In the above other configuration example, when communication using the second communication system succeeded, as illustrated in FIG. 9, the next communication is started without waiting performance of communication using the first communication system, which has the same content as that in a case where the communication using the second communication system succeeded. FIG. 9 is a diagram illustrating a communication example to be performed by the other configuration example when the communication using the second communication system succeeded. In the example illustrated in FIG. 9, communication between the first battery monitoring apparatus 8A and the third battery monitoring apparatus 8C is started without waiting communication using the first communication system, and the third battery monitoring apparatus 8C determines sticking (ON sticking and OFF sticking) of the relay 7A.

In a case where communication using the second communication system failed, the battery monitoring apparatus 8 performs again communication using the second communication system, when the communication using the second communication system succeeds before performance of communication using the first communication system, next communication may be started without waiting communication using the first communication system.

Thus, the failure diagnosis is able to be completed in a short time interval, so that it is possible to shorten a startup time interval of the battery monitoring system 3.

In the above embodiment, the plurality of battery packs 5 of the assembled battery 2 is connected in parallel, however, the plurality of battery packs 5 of the assembled battery 2 may be connected in serial.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A battery monitoring system comprising:
a plurality of battery monitoring apparatuses respectively associated with battery packs, each of the battery monitoring apparatuses including:
  a setting unit that:
    sets a communication system to at least one of:
      a first communication system establishing communication between the plurality of battery monitoring apparatuses regularly every time a first communication period elapses; and
      a second communication system establishing communication between the plurality of battery monitoring apparatuses regularly every time a second communication period elapses, the second communication period being shorter than the first communication period;
    during a failure diagnosis to be performed in a start-up of the corresponding battery monitoring apparatus:
      sets the communication system to the second communication system initially; and
      when communication using the second communication system fails, sets the communication system to the first communication system; and
    after the failure diagnosis, sets the communication system to the first communication system; and
  a communication unit that:
    communicates with another battery monitoring apparatus of the plurality of battery monitoring apparatuses by using the communication system set by the setting unit; and
    during the failure diagnosis, communicates with the other battery monitoring apparatus by using the first communication system when communication using the second communication system fails,
wherein the communication units of the plurality of battery monitoring apparatuses collectively communicate an event result in the first communication system, and collectively communicate an event result each time an event is terminated in the second communication system.

2. The battery monitoring system according to claim 1, wherein the plurality of battery monitoring apparatuses performs communication between two battery monitoring apparatuses of the plurality of battery monitoring apparatuses, and
one battery monitoring apparatus of the two battery monitoring apparatuses is a master battery monitoring apparatus, and another battery monitoring apparatus is a slave battery monitoring apparatus.

3. The battery monitoring system according to claim 1, wherein the communication unit starts a next communication without waiting for communication using the first communication system when the communication using the second communication system succeeds during the failure diagnosis.

4. A battery monitoring apparatus comprising:
a setting unit that:
  sets a communication system to at least one of:
    a first communication system establishing communication between the plurality of battery monitoring apparatuses regularly every time a first communication period elapses; and
    a second communication system establishing communication between the plurality of battery monitoring apparatuses regularly every time a second communication period elapses, the second communication period being shorter than the first communication period;
  during a failure diagnosis to be performed at a start of charge or discharge by one or more battery packs:
    sets the communication system to the second communication system initially; and
    when communication using the second communication system fails, sets the communication system to the first communication system; and
  after the failure diagnosis, sets the communication system to the first communication system; and
a communication unit that:
  performs communication by using the communication system set by the setting unit;
  communicates an event result in the first communication system;
  communicates an event result each time an event is terminated in the second communication system; and
  during the failure diagnosis, communicates using the first communication system when communication using the second communication system fails.

* * * * *